United States Patent [19]

Hofer

[11] Patent Number: 4,560,958
[45] Date of Patent: Dec. 24, 1985

[54] STATE VARIABLE OSCILLATOR HAVING IMPROVED REJECTION OF LEVELER-INDUCED DISTORTION

[75] Inventor: Bruce E. Hofer, Beaverton, Oreg.

[73] Assignee: Tektronix, Inc., Beaverton, Oreg.

[21] Appl. No.: 583,510

[22] Filed: Feb. 24, 1984

[51] Int. Cl.[4] .............................................. H03B 5/20
[52] U.S. Cl. .................................... 331/135; 331/109;
331/183
[58] Field of Search ................ 331/109, 135, 136, 183

[56] References Cited

U.S. PATENT DOCUMENTS 4,340,854 7/1982 Jones et al. ............................ 324/57

Primary Examiner—Eugene R. LaRoche
Assistant Examiner—James C. Lee
Attorney, Agent, or Firm—William A. Birdwell; George T. Noe

[57] ABSTRACT

A state variable oscillator with leveler circuit and with a feedforward circuit for improving the oscillator's rejection of leveler-induced distortion. The feedforward circuit combines a signal representative of a leveler-distorted feedback signal with the main oscillator output to reduce the amount of harmonic distortion, below a certain order, appearing in the output.

5 Claims, 5 Drawing Figures

| TYPICAL VALUE OF A = 2.5 | | |
|---|---|---|
| HARMONIC (n) | $\left(\dfrac{V_o}{V_d}\right)$ FOR $\alpha = 0$ (FIG.1) | $\left(\dfrac{V_o}{V_d}\right)$ FOR $\alpha = 0.1$ (FIG.2) |
| 2 | .467 | .367 |
| 3 | .175 | .075 |
| 4 | .093 | .007 |
| 5 | .058 | .042 |
| 6 | .040 | .060 |
| 7 | .029 | .071 |
| 8 | .022 | .078 |

STATE VARIABLE OSCILLATOR HAVING IMPROVED REJECTION OF LEVELER-INDUCED DISTORTION

BACKGROUND

The present invention relates to state variable sine wave oscillators having leveling circuitry for sensing the output amplitude and modulating the gain of a feedback path to stabilize and control the output amplitude.

A commonly known oscillator topology is the state variable oscillator in which the oscillator circuit provides an analog solution to a second order differential equation resulting in a sinusoidal output signal. The differential equation takes the following form:

$$a \frac{d^2V}{dt^2} + b \frac{dV}{dt} + cV = 0$$

The instantaneous amplitude of the oscillator signal is represented by the term V; and the constants a, b, and c establish the frequency of the oscillator signal. Such circuits typically employ an inverter amplifier stage followed by first and second consecutive integrating amplifier stages, the output from the first integrator being fed back both to inverting and noninverting inputs of the inverter amplifier stage, and the output from the second integrator being fed back to the inverting input of the inverter amplifier stage. Each of the stages comprises an operational amplifier having associated corresponding input and feedback impedances which may be varied to produce oscillation at different frequencies and amplitudes.

All oscillators require leveler circuitry to stabilize and control their output amplitudes. Most leveler designs sense the oscillator's output amplitude, convert the amplitude into a DC control signal (with some inevitable AC ripple), and modulate the gain of a feedback path as necessary to maintain the desired output amplitude. Unfortunately the AC ripple in the control signal causes harmonic distortion of the oscillator output by the mixing of the fundamental oscillation feedback signal with the undesired AC ripple component of the control signal.

As mentioned in Hofer, *A Comparison Of Low Frequency RC Oscillator Topologies* (paper presented at 64th AES convention), the state variable oscillator topology is inherently superior to other types in its rejection of such leveler-induced distortion; however, further improvements in rejection are desirable.

Certain approaches for improvements in such rejection have been suggested by Meyer-Ebrecht, *Fast Amplitude Control Of A Harmonic Oscillator,* Proc. IEEE (Lett.), volume 60, page 736, June 1972; Vannerson and Smith, *Fast Amplitude Stabilization Of An RC Oscillator,* IEEE J. Solid State Circuits, volume SC-9, pages 176–179, August 1974; and Vannerson and Smith, *A Low Distortion Oscillator With Fast Amplitude Stabilization,* Int. J. Electronics, volume 39, pages 465–472, 1975. These approaches employ sample/hold or multiple phase/detection circuits to reduce the distortion. Another possibility is to use switchable filters or leveler range-changing circuits to reduce the ripple component of the leveler control signal. However, none of these suggestions is free of drawbacks and therefore none offers an optimum solution to the problem.

SUMMARY OF THE PRESENT INVENTION

The present invention improves the rejection of leveler-induced distortion in a state variable oscillator by providing a feedforward path for adding to the main oscillator output a signal representative of the feedback signal which has been distorted by leveler gain modulation, so as to partially cancel the harmonic distortion products in the output which have originated in the leveler control signal. By combining some of the distorted feedback signal, through the feedforward path, with the main output of the oscillator, it is possible to reduce greatly the amount of harmonics, below a certain order, that appear in the output. Because the dominant harmonics causing distortion are usually second to fourth order, the invention can substantially reduce total harmonic distortion of the oscillator output.

Accordingly, it is a primary objective of the present invention to improve the rejection of leveler-induced total harmonic distortion in a state variable oscillator.

It is a further primary objective of the present invention to accomplish such improvement by means of a feedforward path which adds a signal, representative of the leveler-distorted feedback signal, to the main oscillator output.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
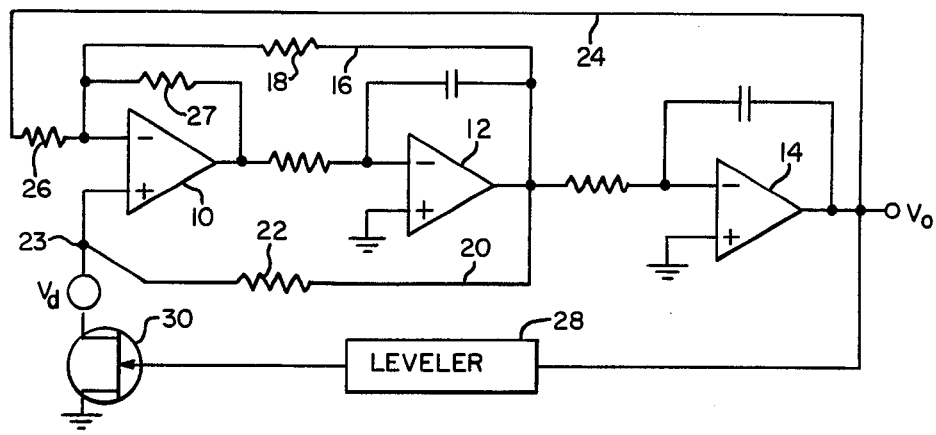
FIG. 1 is a circuit diagram of a typical prior art state variable oscillator having a leveler circuit and resultant leveler-induced distortion in its output.

A conventional state variable oscillator with a leveler circuit is shown in FIG. 1. The oscillator employs an inverter amplifier stage 10 followed by first and second consecutive integrating amplifier stages 12 and 14, respectively. The output from the first integrator 12 is fed back through line 16 and resistor 18 to the inverting input of the inverter amplifier stage 10, and through line 20 and resistor 22 to the noninverting input 23 thereof. The output from the second integrator 14 is fed back through line 24 and resistor 26 only to the inverting input of the inverter amplifier stage 10. Each of the stages comprises an operational amplifier having associated corresponding input and feedback impedances as shown which may be varied to produce oscillation at different frequencies and amplitudes.

A leveler 28 senses the oscillator's AC output amplitude and converts it into a control signal dependent upon the AC amplitude and some predetermined reference. This control signal is substantially DC, but it contains some AC ripple. The control signal controls a field effect transistor 30 which modulates the gain through feedback path 20 and thereby causes the output oscillations to grow or decay as required to stabilize about a fixed amplitude. However, the AC ripple in the control signal causes harmonic generation due to mixing with the fundamental oscillation signal in the feedback path 20 producing a harmonic distortion voltage component Vd at the noninverting input 23 of the inverter amplifier stage 10. These undesirable harmonics show up in the oscillator output Vo according to the following relationship:

$$\frac{Vo}{Vd} = \left(1 + \frac{1}{A}\right)\left[\frac{1}{1 - n^2}\right]$$

where n=harmonic order, and A=inverter stage gain ($R_{27}/R_{26}$) (assuming resistance 22 is much greater than the resistance of field effect transistor 30 and equal value resistors and capacitors are used in the two integrator stages).

For purposes of descriptive simplicity the two integrator stage resistor and capacitor values have been assumed equal. An alternative but less practical embodiment would contain unequal values, the effect of which would be a different value for 'A'.

Figure 2:
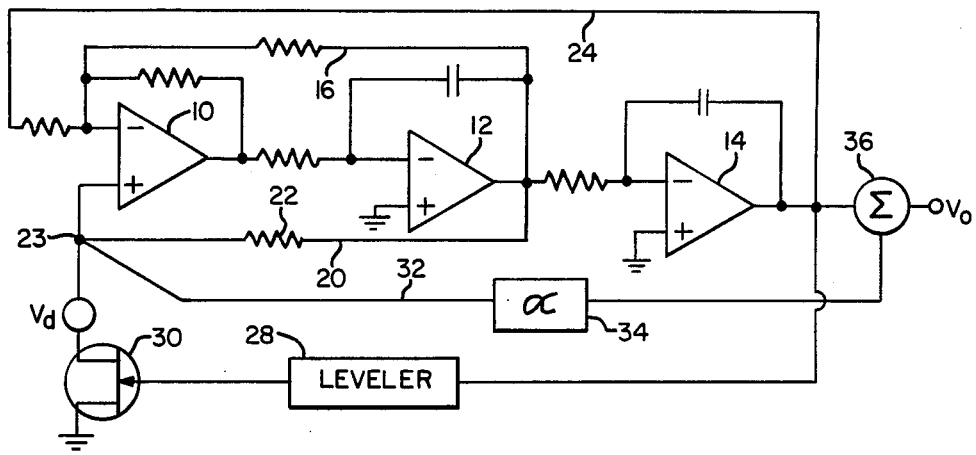
FIG. 2 is a circuit diagram of the state variable oscillator of FIG. 1 modified in accordance with the present invention by a feedforward circuit shown in simplified form.

FIG. 2 depicts the same state variable oscillator with a leveler circuit as in FIG. 1, except that it includes a feedforward path 32 from the non-inverting input 23 of the inverter amplifier 10 to the output of the second integrator 14, together with a negative gain control 34 for transferring only a predetermined portion of the distortion signal Vd, and a summation stage 36 for adding such portion to the output of the second integrator 14. By the inclusion of the feedforward circuit, it is possible to reduce greatly the amount of undesirable harmonics from the distortion voltage component Vd which appear in the oscillator output Vo, below a predetermined order, in accordance with the following relationship:

$$\frac{Vo}{Vd} = \left(1 + \frac{1}{A} + \alpha\right)\left[\frac{1 - \left(\frac{n^2 A \alpha}{1 + A(1 + \alpha)}\right)}{1 - n^2}\right]$$

where n=harmonic order, A=inverter stage gain, and α=feedforward path gain (again assuming resistance 22 is much greater than the resistance of field effect transistor 30).

Figures 4, 5:
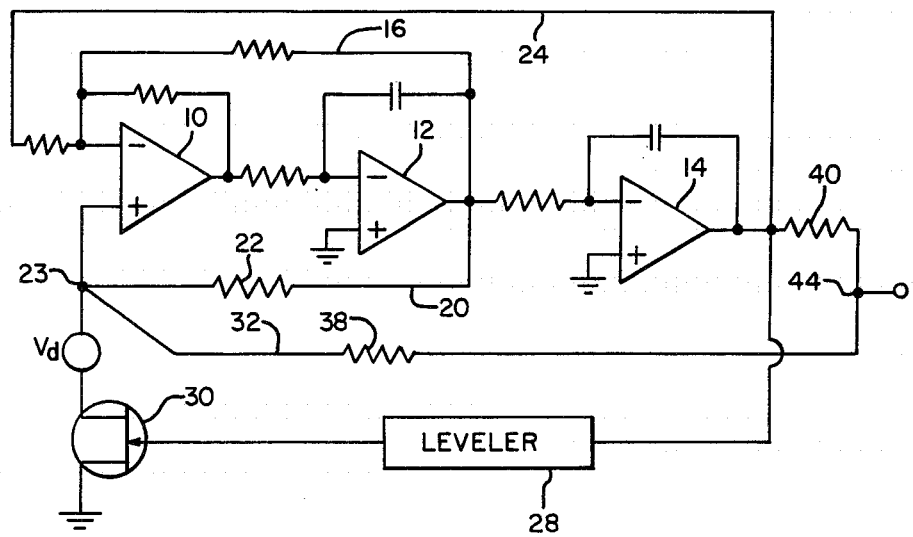
FIG. 4 is a circuit diagram of the state variable oscillator of FIG. 1 modified by a second exemplary embodiment of a feedforward circuit in accordance with the present invention.
FIG. 5 is a table showing exemplary comparisons of harmonic distortion in the circuits of FIGS. 1 and 2, respectively, for a typical practical design with equal integrator stage capacitor and resistor values and an inverter stage gain of 2.5.

Exemplary comparisons, according to harmonic order, of the portions of the harmonic distortion component Vd which show up in the oscillator output Vo for the circuits of FIGS. 1 and 2, respectively, are shown in FIG. 5. Assuming a typical inverter stage gain value A of 2.5 for both figures, equal value integrator stage resistor and capacitor values, and a feedforward gain value α of 0.1 for the circuit of FIG. 2, it can be seen from FIG. 5 that the circuit of FIG. 2 permits a substantially smaller portion of the harmonic distortion source Vd to show up in the oscillator output Vo for harmonic orders below 5. Because the dominant harmonics in leveler-induced distortion are usually second to fourth order, the circuit of FIG. 2 can substantially reduce output total harmonic distortion.

Figure 3:
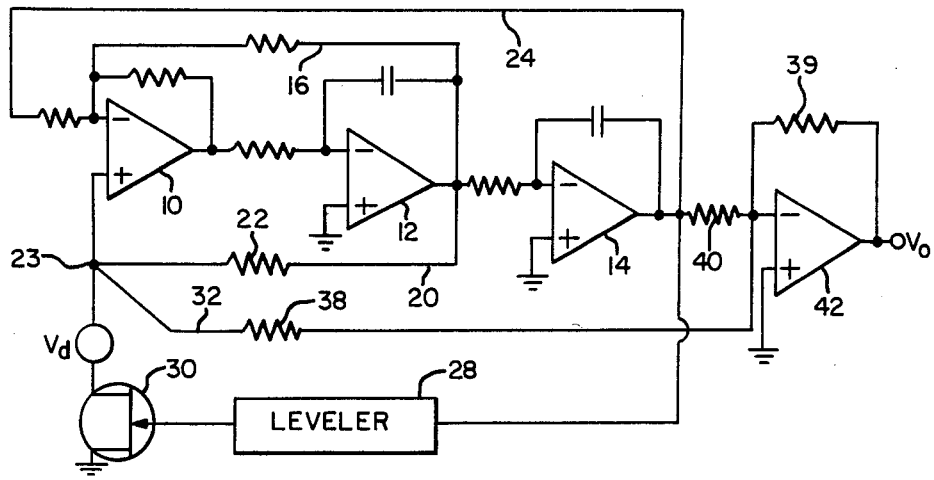
FIG. 3 is a circuit diagram of the state variable oscillator of FIG. 1 modified by a first exemplary embodiment of a feedforward circuit in accordance with the present invention.

FIGS. 3 and 4 show specific alternative exemplary embodiments of feedforward circuitry in accordance with the present invention. In FIG. 3, resistors 38 and 39 and operational amplifier 42 determine the gain in the feedforward path 32. Those components, along with resistor 40, determine the relative amounts of output from the second integrator 14 and feedforward signal that are added to produce the oscillator output Vo, the input to operational amplifier 42 providing the summing function. In FIG. 4, resistors 38 and 40 and a node 44 serve the same basic gain, proportioning, and summing functions.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:
1. A state variable oscillator comprising:
    (a) an inverter amplifier having an inverting input, a noninverting input and an output;
    (b) a first integrator having an input and an output, the input being connected to the output of said inverter amplifier, and the output being connected through a first feedback path to the inverting input of said inverter amplifier and through a second feedback path to the noninverting input thereof;
    (c) a second integrator having an input and an output, the input being connected to the output of said first integrator, and the output being connected through a third feedback path to the inverting input of said inverter amplifier;
    (d) leveler means connected to the output of said second integrator and to the noninverting input of said inverter amplifier for varying the gain of said inverter amplifier in response to the output amplitude of said second integrator; and
    (e) feedforward means connected to the noninverting input of said inverter amplifier and to the output of said second integrator for adding to the output of said second integrator a signal representative of the signal at the noninverting input of said inverter amplifier, thereby producing an oscillator output.

2. The oscillator of claim 1 including gain means associated with said feedforward means for adding to the output of said second integrator a portion, less than all, of the signal at the noninverting input of said inverter amplifier.

3. The oscillator of claim 2 wherein said gain means includes a resistor operatively interposed in said feedforward means between the noninverting input of said inverter amplifier and the output of said second integrator.

4. The oscillator of claim 3 wherein said feedforward means is connected to the output of said second integrator at a node, further including a second resistor operatively interposed between the output of said second integrator and said node.

5. The oscillator of claim 4 wherein said node is connected to the inverting input of an operational amplifier and a third resistor is connected from the output of said operational amplifier to said inverting input thereof.

* * * * *